United States Patent [19]

Chiao et al.

[11] Patent Number: 5,568,144
[45] Date of Patent: Oct. 22, 1996

[54] METHOD FOR IMPROVING WAVEFORM DIGITIZATION AND CIRCUIT FOR IMPLEMENTING SAID METHOD

[75] Inventors: Richard Y. Chiao, Clifton Park; Ralph A. Hewes; Robert S. Gilmore, both of Burnt Hills, all of N.Y.

[73] Assignee: General Electric Company, Schenectady, N.Y.

[21] Appl. No.: 348,011

[22] Filed: Dec. 1, 1994

[51] Int. Cl.⁶ .................................................. H03M 1/18
[52] U.S. Cl. ............................................ 341/139; 341/141
[58] Field of Search ...................................... 341/127, 138, 341/139, 141, 143, 155

[56] References Cited

U.S. PATENT DOCUMENTS

| | | | |
|---|---|---|---|
| 3,790,947 | 2/1974 | Campbell et al. | 341/131 |
| 4,016,557 | 4/1977 | Zitelli et al. | 341/139 |
| 4,383,247 | 5/1983 | Assard | 341/139 |
| 4,581,725 | 4/1986 | Pilarcik, Jr. | 367/66 |
| 4,999,628 | 3/1991 | Kakubo et al. | 341/139 |
| 5,250,948 | 10/1993 | Berstein et al. | 341/131 |
| 5,422,643 | 6/1995 | Chu et al. | 341/141 |

*Primary Examiner*—Marc S. Hoff
*Attorney, Agent, or Firm*—Paul R. Webb, II

[57] ABSTRACT

A method and circuit for improved digitization of waveforms having a large dynamic range, including selecting a signal threshold value which partitions the dynamic range of the waveform into a small signal region and a large signal region; sampling the waveform to obtain a sampled signal therefrom at a given sampling frequency; for each sampled signal, comparing the sampled signal with the signal threshold value to determine whether the sampled signal is within the small signal region or the large signal region; and directly digitizing the sampled signal if the sampled signal is within the small signal region or differentially digitizing the sampled signal if the sampled signal is within the large signal region, wherein differentially digitizing the sampled signal includes digitizing a value representing the difference between the sampled signal at a present sampling instant and a previous sampling instant. One bit of each word of the digitized signal is reallocated to indicate whether it represents a directly or differentially digitized signal to enable the waveform to be digitally reconstructed in a data processing device.

21 Claims, 5 Drawing Sheets

METHOD FOR IMPROVING WAVEFORM DIGITIZATION AND CIRCUIT FOR IMPLEMENTING SAID METHOD

BACKGROUND OF THE INVENTION

The present invention relates to the field of medical imaging and non-destructive evaluation, and more particularly to an improved method and circuit for more accurately digitizing waveforms having a large dynamic range.

Many methods used in the fields of medical imaging and non-destructive evaluation (NDE) of materials, such as ultrasonic pulse-echo inspection, produce broad band signals with a large dynamic range. With the advent of waveform processing the ability to obtain full waveform data has become important. Back-scattered acoustic signal used in medical imaging and ultrasonic NDE are generally broad band signals with a large dynamic range. For example, such signals may fluctuate between 10 v and 0.01 v.

Conventional ultrasonic NDE methods such as viewing A-SCANs and recording C-SCANs do not require the digitization of the complete acoustic waveform. However, a significant amount of useful information may be lost by recording data corresponding to only peak amplitudes. In order to take advantage of advanced signal processing algorithms for flaw detection, such as SAFT, tomography, split-spectrum and polarity thresholding, the ability to acquire full waveform data with the highest fidelity is necessary.

Full waveform digitization of signals having a large dynamic range requires a high sampling rate and large word length. The combination of these two requirements precludes most conventional and reasonably priced A/D converters from being used to digitize full waveforms with low quantization error. For example, a common signal used for NDE of metals has a bandwidth of 100% around a center frequency of 5 MHz, and the front surface or flaw echo is often several times larger than other echoes from within the metal. Because of multiple frequency components contained in broad-band pulses, digitization of such signals requires a high sampling rate to satisfy the Nyquist sampling criterion and a large word length to minimize the quantization error.

Obviously, a larger dynamic range or a smaller word length results in a larger quantization error in the digitized data. Thus, one way to decrease the quantization error is to use an A/D converter having larger word length. However, A/D converters having large word lengths are generally limited in speed. The cost of A/D converters significantly increases as the speed and word length thereof is increased. Of course, there is a limit as to the word length and the speed which can be achieved with conventional A/D converters. As this limit is approached, the cost of the A/D converter greatly increases. Thus, there is a need for some other means of minimizing the quantization error of conventional A/D converters without increasing the word length thereof.

BRIEF DESCRIPTION OF THE PRIOR ART

One method used to reduce the quantization error when digitizing waveforms is to set the range of the A/D converter to a sufficiently small range to enable the small amplitude signals to be digitized with high fidelity. While this method enables a reduction in quantization error for the small amplitude values, large amplitude values will be truncated or clipped because they will be out of the range of the converter. As a result, all of the potentially valuable information in the large amplitude signals is lost. On the other hand, if the conversion range of the A/D converter is set sufficiently large to prevent clipping, the quantization error is increased proportionally.

If the range of the converter is set below the full dynamic range of the signal, clipping will preclude the entire waveform from being digitized. In fact, signals occurring outside of the conversion range are completely lost. The small-signal quantization error is determined by the conversion range and the number of bits (word length) of the A/D converter. While the small-signal quantization error may be reduced by adjusting the conversion range, the large signal quantization error is greatly increased due to over-range or clipping thereof.

Therefore, adjusting the range of the A/D converter cannot effectively be used to reduce the quantization error when it is necessary or desirable to digitize the full acoustic waveform.

The problem of reducing the quantization error corresponds to the problem of increasing the dynamic range of the A/D converter. One prior method of increasing the dynamic range of a converter is to use non-linear quantization by applying logarithmic amplification prior to digitization. This method basically compresses the dynamic range of the signals prior to digitization. However, this method has limited applicability for ultrasonic signals because logarithmic amplifiers have a limited bandwidth of about 20 MHz, while ultrasonic signals often exceed 100 MHz.

A major disadvantage of prior art schemes is that they do not provide a method or device for reducing the quantization error while still enabling the entire waveform to be digitized. The Delta-Sigma digitizer uses differential digitation on the entire signal. Thus, the signal is not split into large and small signal regions which requires high sampling rates. Further, quantization error accumulates on reconstruction.

SUMMARY OF THE INVENTION

A primary object of the present invention is to provide simple and inexpensive method and device for enabling full waveform digitization while providing more favorable quantization error distribution than has heretofore been achieved.

A more specific object of the present invention is to provide a method and device which enables the quantization error to be shifted from the more sensitive low amplitude signals' regions to the more robust high amplitude signal regions.

A further object of the invention is to provide a method and device for improving the performance of conventional and inexpensive A/D converters when digitizing waveforms having a large dynamic range.

Another object of the invention is to provide a method and device for digitizing waveforms which achieve a reduction in quantization error without increasing the word length of the A/D converter used therein.

Yet another object of the invention is to provide a method and device for digitizing waveforms which enables coarseness in small amplitude regions to be reduced while still enabling the full waveform to be digitized without clipping.

These and other objects and advantages: are achieved by the present invention which provides a method for digitizing waveforms, including the steps of selecting a signal threshold value which partitions the dynamic range of the waveform into a small signal region and a large signal region; sampling the waveform to obtain a sampled signal waveform at a given sampling frequency; comparing each sampled signal with the signal threshold value to determine whether the sampled signal is within the small signal region or the large signal region; and directly digitizing the sampled signal if it is within the small signal region or differentially digitizing the sampled signal if it is within the large signal region, wherein differentially digitizing the sampled signal includes digitizing a value representing the difference between the sampled signal at the present sampling instant and the previous sampling instant.

The aforenoted method for digitizing waveforms may be implemented in accordance with the present invention by a circuit which comprises means for defining a signal threshold value which partitions the dynamic range of the waveform into a small signal region and a large signal region; means for sampling the waveform to obtain a sampled signal therefrom at a given sampling frequency; means for comparing the sampled signal with the signal threshold value to determine whether the sampled signal is within the small signal region or the large signal region; and means for digitizing the sampled signal. The means for digitizing the sampled signal comprises means for directly digitizing the sampled signal if the sampled signal is within the small signal region and means for differentially digitizing the sampled signal if the sampled signal is within the large signal region, wherein the means for differentially digitizing the sampled signal includes means for digitizing a value representing the difference between the sampled signal at a present sampling instant and a previous sampling instant.

In accordance with one aspect of the invention, the step of directly or differentially digitizing the sampled signal includes using an A/D converter having an N-bit output, and further includes the step of allocating one bit of the N-bit output to be a flag bit which indicates whether the sampled signal was digitized directly or differentially.

In accordance with another aspect of the invention, the signal threshold value is selected such that it has a value which is less than half of the full dynamic range of the waveform.

A further aspect of the invention involves using a sampling clock having a sampling frequency which enables the differentially digitized signals to be within the small signal range to avoid clipping thereof.

In accordance with one embodiment of the invention, the step of sampling the waveform includes using a first sampling clock having a first sampling frequency when directly digitizing the sampled signal and using a second sampling clock having a second sampling frequency when differentially digitizing the sampled signal, wherein the first sampling frequency is substantially equal to the Nyquist sampling rate and the second sampling frequency is high enough to enable differential signals to fall within the small signal range.

In accordance with yet another aspect of the invention, the flag bit is used when digitally reconstructing the waveform in a data processing device to indicate whether each word of the digital data represents a direct or differentially digitized signal.

In accordance with a further aspect of the invention, various embodiments of a circuit for implementing the method of the present invention are provided.

BRIEF DESCRIPTION OF THE DRAWINGS

Other objects and advantages of the subject invention will become more readily apparent from a study of the following specification when viewed in light of the accompanying drawings, in which.

DETAILED DESCRIPTION OF THE PREFERRED EMBODIMENT

Figure 1:
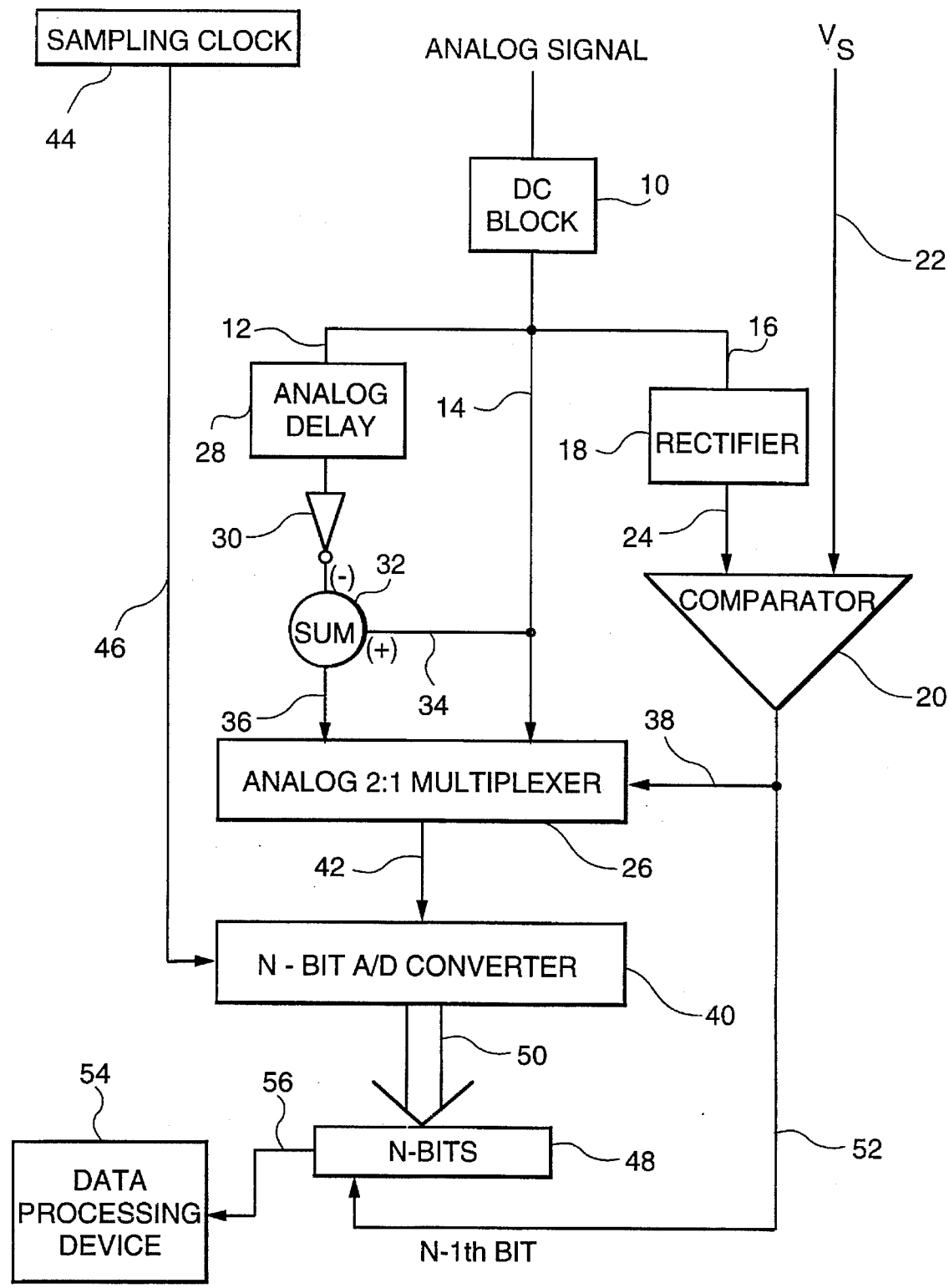
FIG. 1 depicts a circuit for implementing the method of the present invention.
Figure 3:
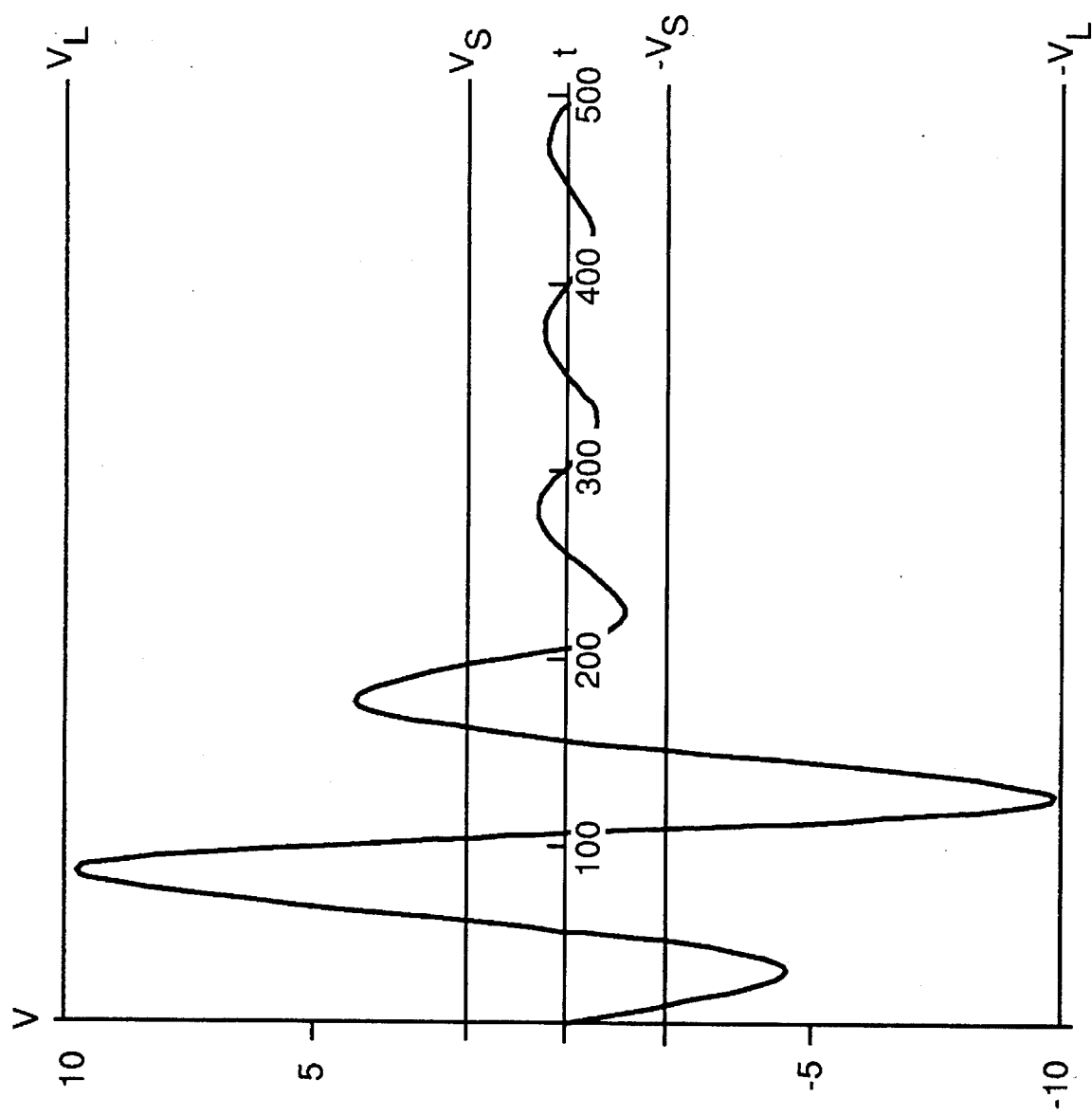
FIG. 3 shows an acoustic waveform divided into small and large signal regions.

Referring now to the drawings, and more particularly to FIGS. 1 and 3, the method of the present invention is initiated by partitioning the full dynamic range of an analog signal to be digitized into a small signal region and a large signal region. As shown in FIG. 3, the waveform is partitioned by choosing a signal threshold value $(V_s)$ which defines a maximum amplitude for signals in the small signal region. In other words, any signal in the waveform having an absolute amplitude within the threshold value $(V_s)$ (from $-V_s$ to $+V_s$) is considered to be in the small signal region of the waveform, and any signal having an absolute amplitude outside of the small signal threshold value is considered to be in the large signal region of the waveform.

As will be explained in greater detail below, the threshold value $(V_s)$ is preferably selected to having a value which is less than half of the full dynamic range of the waveform. Thus, in the example waveform of FIG. 3 having a dynamic range of $-10$ V to $10$ V, the threshold value should be selected to have an absaolute value which is less than 5 V. In general, the threshold value should be selected such that it is slightly higher than amplitude values which are desired to be digitized with high fidelity or low quantization error. The exact value of the threshold is a design parameter which can be varied in accordance with the particular application in which the present method is used.

The present method has particular utility in digitizing waveforms of the type shown in FIG. 3, wherein the waveform includes large and small amplitude fluctuations. These type of waveforms commonly occur in medical imaging and NDE, wherein the front surface and/or flaw echo is often several times larger than the echoes from within the part.

Once a threshold value is selected for the particular application in accordance with the criterion set forth above, the range of the A/D converter used to digitize the waveform is set to correspond to the threshold value. Inasmuch as the range of the A/D converter will be set to less than half of the full dynamic range of the waveform, the entire waveform cannot be digitized in a conventional manner due to over-range or clipping. However, full waveform digitization is achieved by the present method by selectively digitizing the waveform using two different method depending on whether the signal therefrom is within the image signal range ($-V_s$ to $+V_s$) or outside the range.

In accordance with the present invention, the full dynamic range of the waveform is split into two bands, the small signal region and the large signal region, by the threshold value ($V_s$), and signals within each region are digitized using different methods. Absolute values of sampled signals from the waveform are compared with the threshold value ($V_s$) to determine whether the sampled signal is within the small or large signal regions. If the comparison indicates that the sampled signal falls within the small signal region, the sampled signal is directly digitized. In other words, small amplitude signals are digitized by generating a bit sequence or word which contains the actual value of the sampled signal.

On the other hand, if the sampled signal is larger than the threshold value, the sampled signal is differentially rather than directly digitized. Thus, large amplitude signal values are digitized by generating a bit sequence or word which contains a value representing the difference between the sampled signal at the present sampling instant and the previous sampling instant. In accordance with the present invention, the sampling frequency of the sampling clock used in sampling the waveform must be sufficiently high so as to enable the differential value to fall within the range of the A/D converter. If the sampling frequency is not high enough, the differential value may be clipped due to overrange, thereby precluding the full waveform from being digitized. Therefore, in general, the sampling frequency must be higher as the threshold value or range of the A/D converter is decreased.

In order to determine whether each bit sequence or word generated by the A/D converter contains a directly or differentially digitized signal, one bit of the word is reallocated to be a flag bit. The flag bit is used as a toggle switch to indicate whether the word contains a directly or differentially digitized signal. By using a flag bit, the waveform can be digitally reconstructed once the output data from the A/D converter is loaded and stored in an information processing device. Through the use of a suitable software routine or the like, each word of the digital data can be used to digitally reconstruct the waveform by checking the state of the flag bit and either directly using the value thereof if the word contains a directly digitized signal, or adding the contents of the word to the previous word if the word contains a differentially digitized signal. In other words, depending on the state of the flag bit, the digitized signal is equal to either the A/D converter data or the sum of the A/D converter data and the previous digitized signal.

Since the Nth bit of the N-bit output of an A/D converter is typically used as he sign bit, the N-1th bit may be reallocated as the flag bit. However, any other suitable bit may be used as the flag bit.

Inasmuch as one bit is allocated as a flag bit, the possible values which the word can represent is reduced by a factor of two. This is why it is preferable when using the method of the present invention to set the threshold value or range of the A/D converter to a value which is less than half of the full dynamic range of the waveform. The small signal quantization error is determined by the signal range and the number of bits (word length) of the A/D converter. As a result, when one bit is allocated as a flag bit, the range of the converter must be decreased by more than a factor of two in order to reduce the quantization error in the small signal region. Thus, by selecting a threshold value which is less than half of the full dynamic range of the waveform signal, and setting the range of the converter to correspond to the threshold value, the quantization error in the small signal region can be reduced while still enabling the entire waveform to be digitized.

Since the large amplitude digitized signal is reconstructed by summing the digitized difference components, the quantization error for the large signal region is dominated by the sum of the individual quantization errors and may therefore be larger than the quantization error achieved by conventional methods. However, this re-distribution of quantization error from the small to large amplitude regions is often a highly favorable result because of the critical nature of the signal-to-noise ratio in the small signal region and because of the short duration of the large amplitude signals in most acoustic back-scattered data. Thus, using the present method and encoding the digitized data in the manner described above, the original signal can be reconstructed with significantly better signal-to-quantization-noise ratio than direct A/D conversion.

In accordance with the invention, the resulting digitized signal can be decimated to the Nyquist frequency since the A/D converter output is generally oversampled to enable the differentially digitized data to fall within the range of the converter. In other words, since the sampling frequency used is typically much higher than that required to resolve the waveform under the Nyquist sampling criterion, the resulting data set can be reduced to correspond to the Nyquist frequency once the signal is digitally reconstructed in the data processing device.

As will be explained in greater detail below with respect to FIG. 2, in an alternative embodiment of the present invention two separate sampling clocks having different sampling frequencies are used when sampling the small and large signal regions, respectively, thereby enabling a reduction in the amount of oversampling which occurs in the small signal region.

Referring now more particularly to FIG. 1, wherein a preferred embodiment of a circuit for implementing the method of the present invention is illustrated, the analog signal is received and the zero volt or DC signal thereof is blocked by DC block 10, which may for example be in the form of a capacitor. The signal is then fed into three lines 12, 14 and 16. The signal in line 16 is fed into a rectifier 18. The output of the rectifier 18 is connected to a first input of a comparator 20 via line 24. The signal threshold value ($V_s$), selected in accordance with the criterion set forth above, is fed via line 22 to a second input of the comparator 20. The comparator 20 is operable to compare the rectifier signal with the threshold value ($V_s$) and output a signal which indicates whether the rectified signal falls within the small signal region or the large signal region.

The analog signal is also fed via line 14 directly to a first input of an analog 2:1 multiplexer 26. The analog signal on line 12 is fed through an analog delay device 28, inverter 30, and a summing device 32 which receives input from line 14 via line 34, thereby generating a differential signal on line 36 which is connected to a second input of the multiplexer 26. The differential signal on line 34 represents the incremental change in the analog signal from one time instant to the next.

The multiplexer 26 is gated by the output of the comparator 20 which is input thereto via line 38. Thus, depending on the output of the comparator 20, either the analog signal from line 14 or the differential signal from line 36 is output from the multiplexer 26 and input to an N-bit A/D converter 40 via line 42.

The A/D converter 40 converts the analog signal received from the multiplexer 26 into a digital signal in accordance with a given sampling frequency defined by sampling clock 44 which is connected to the converter 40 via line 46. The analog delay 28 is set to correspond to the sampling frequency of the sampling clock 44. Thus, at each sampling instant a sequence of N bits 48 or a word of data is output from the converter 40, which N bits contain either a directly or differentially digitized signal. In order to indicate whether a direct or differential signal was digitized, the output of the comparator 20 is used to reallocate one of the N bits as a flag bit. This can be achieved by simply disconnecting one of the N output lines 50 of the A/D converter 40 and replacing the disconnected line with an output line 52 of the comparator 20. In the exemplary embodiment of FIG. 1, the N-1th bit is reallocated as the flag bit.

Each output word 48 is then input to and stored in the data processing device 54 via line 56. The digital data set can then be used to digitally reconstruct the waveform in the data processing device 52 by using the flag bit as explained in detail above. Depending on the state of the N-1th bit, the digitized signal is equal to the A/D converter data or the sum of the A/D converter data and the previous digitized signal.

As explained in detail above, the sampling frequency defined by the sampling clock must be high enough to enable the differential digitized values to fall within the range of the A/D converter. Inasmuch as this frequency may be many times higher than the Nyquist frequency, significant oversampling of the waveform may occur when using the circuit of FIG. 1.

Figure 2:
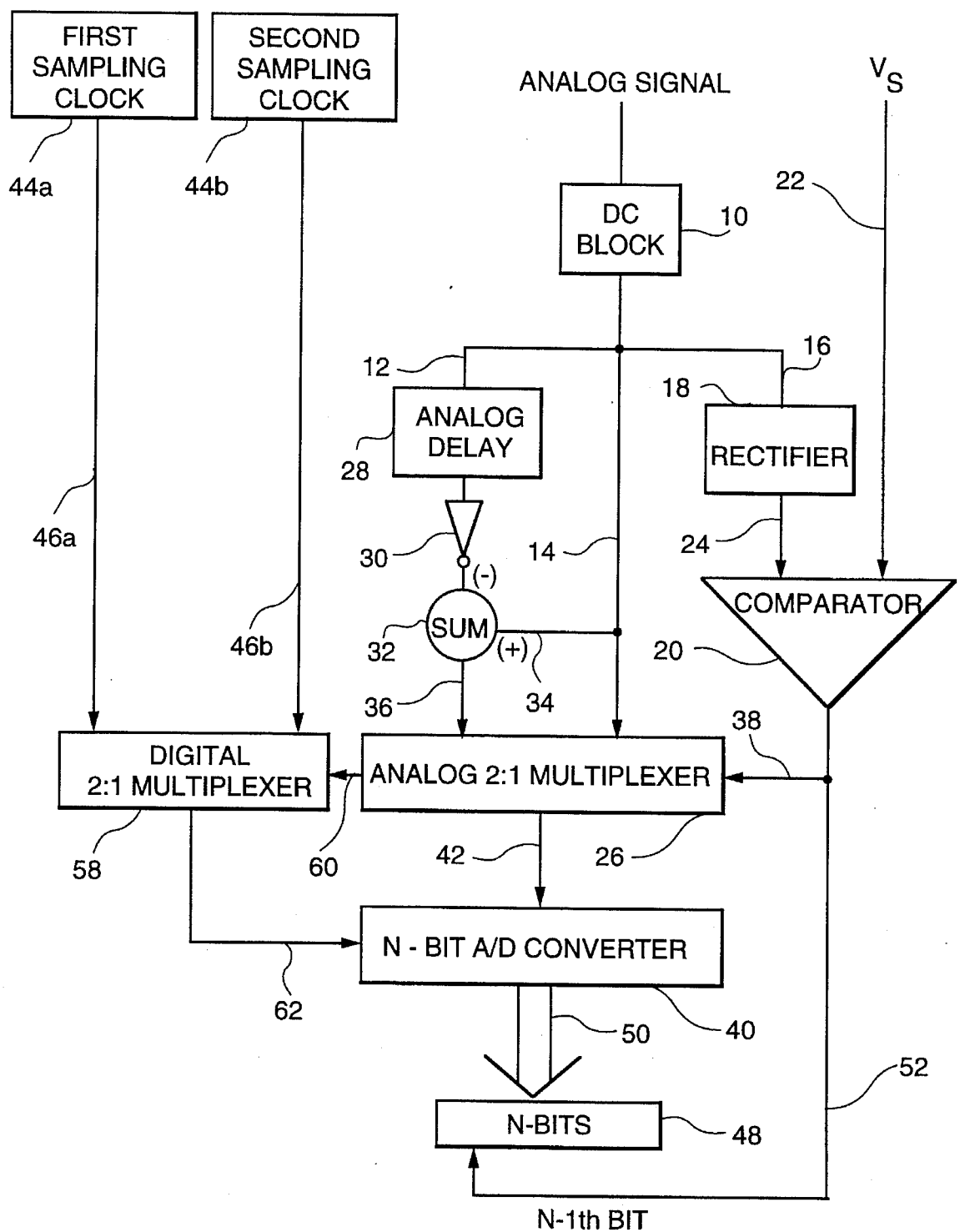
FIG. 2 depicts an alternative embodiment of a circuit for implementing the method of the present invention.

The circuit of FIG. 2 represents an alternative embodiment of the present invention, which circuit enables a reduction in the amount of oversampling which occurs in the small signal region. All of the elements of FIG. 2 having the same reference numerals as those of FIG. 1 operate in the same manner as described above. However, in the embodiment of FIG. 2 two sampling clocks 44a and 44b are provided for use when directly and differentially digitizing the signal, respectively. The sampling signals from the two sampling clocks 44a and 44b are input to a digital 2:1 multiplexer 58 via lines 46a and 46b, respectively. The multiplexer 58 is gated by the output of the comparator 20 via line 60. Thus, depending on the output of the comparator, one of the two clock signals from sampling clocks 44a and 44b is output from the multiplexer 58 and input to the A/D converter 38 via line 62.

The first sampling clock 44a is preferably selected to have a sampling frequency which is greater than the Nyquist frequency, and is used when digitizing the small signal region of the waveform, thereby minimizing the amount of data generated thereby. The second sampling clock 44b is synchronized with the first clock and selected to have a frequency which is high enough to enable the differentially digitized values to fall within the small signal region so they are not clipped by the A/D converter 40 due to over-range. Of course, the analog delay device 28 must also be adjusted to correspond to the sampling frequency used.

While FIGS. 1 and 2 illustrate preferred embodiments of the present invention, other embodiments which achieve the same result can be used. For example, it is within the scope of the invention to digitize both the analog signal and the difference signal and to multiplex the output of the A/D converters. This embodiment would require two A/D converters and a digital rather than an analog multiplexer.

Figure 4:
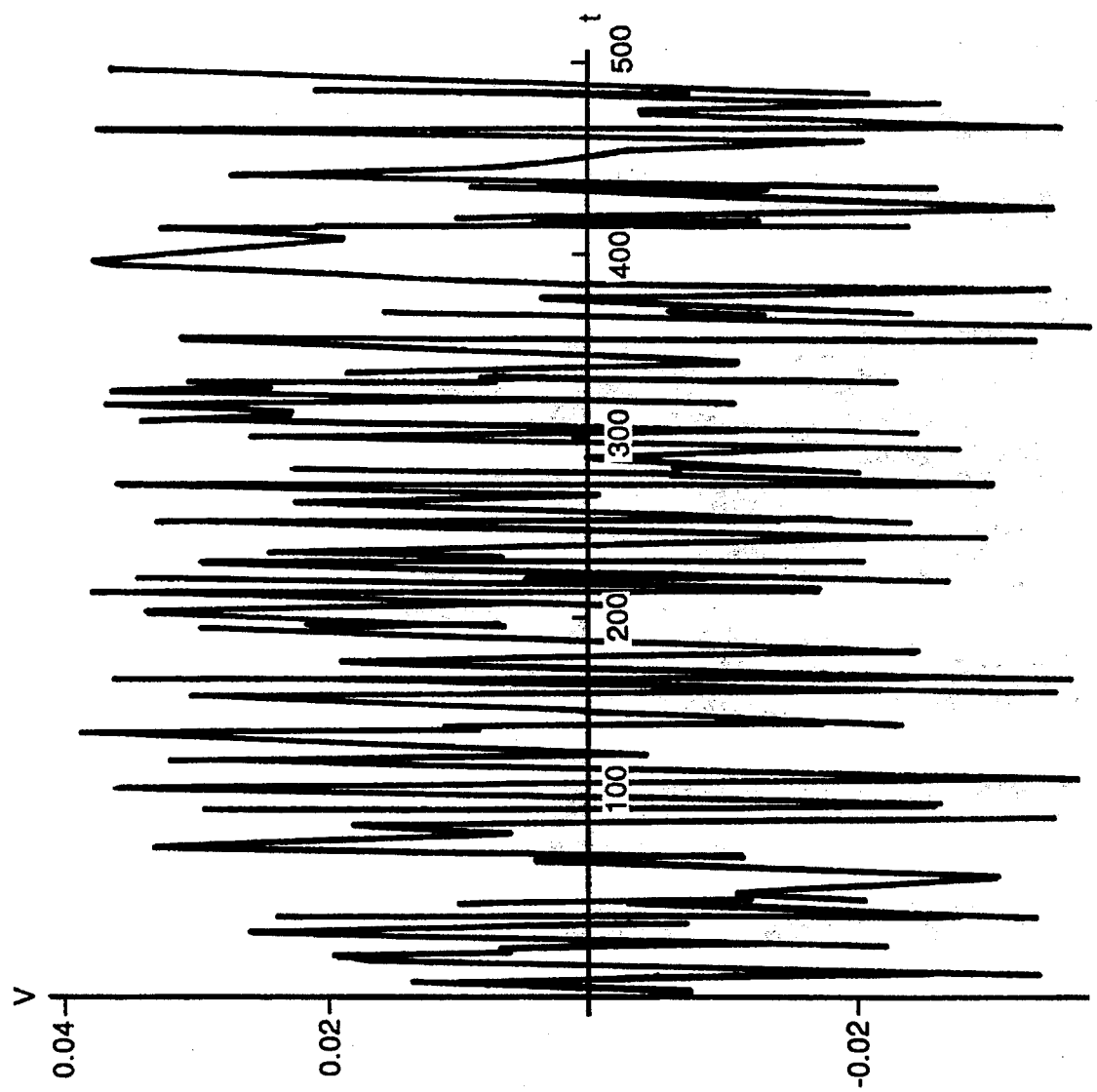
FIG. 4 shows computer simulated results of the digitization of the waveform of FIG. 3 with a conventional method and A/D converter.
Figure 5:
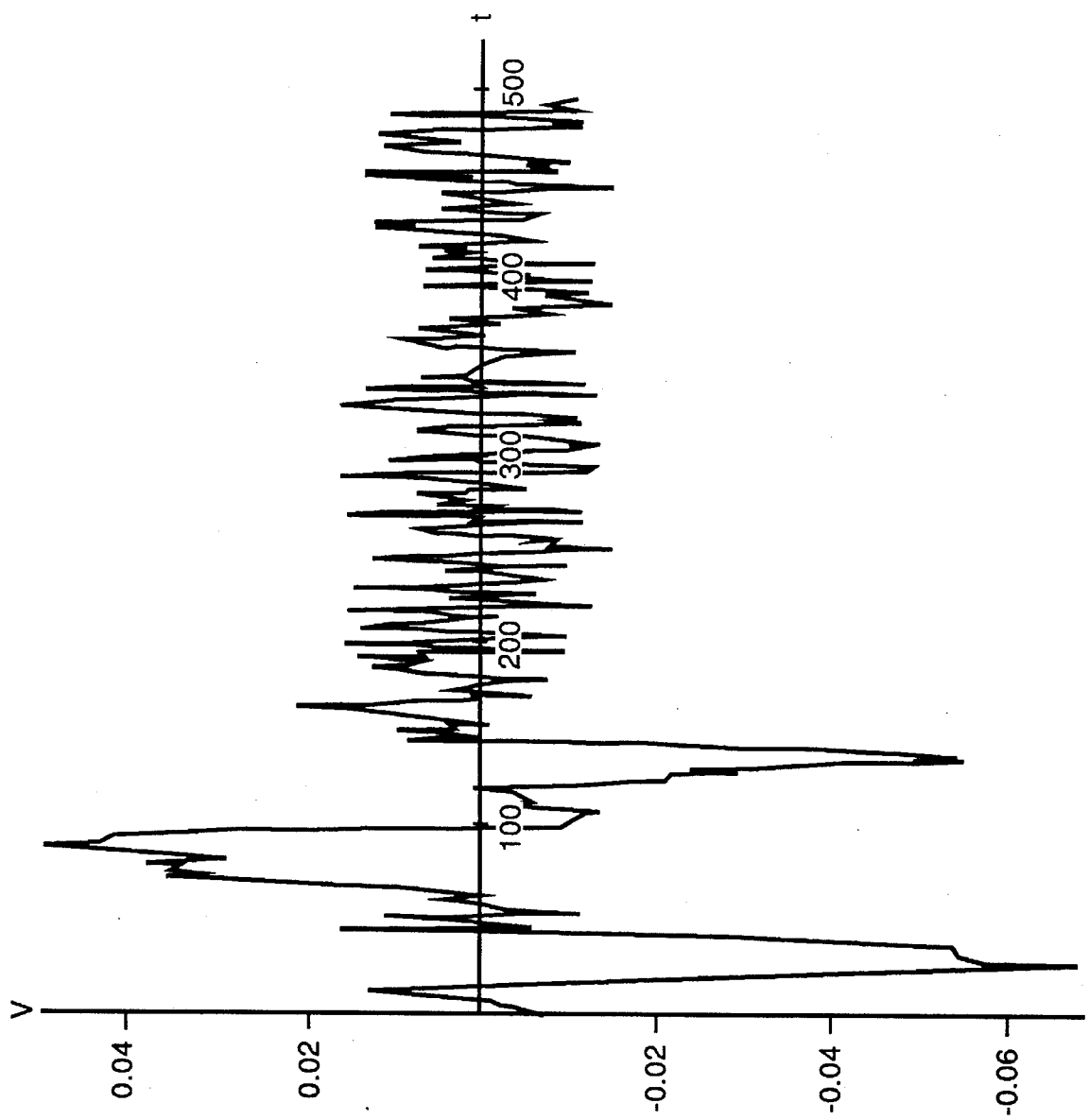
FIG. 5 shows computer simulated results of the digitization of the waveform of FIG. 3 with the method and device of the present invention.

FIGS. 4 and 5 illustrate computer simulated results of the quantization error produced when digitizing the waveform of FIG. 3 with a conventional A/D converter and by the method and device of the present invention, respectively. The signal clock embodiment of FIG. 1 was used in this simulation with a sampling rate of 33 times the center frequency. It is apparent that the quantization error produced when using the present invention is reduced in the small signal region and increased in the large signal region. In going from the conventional method to the method of the present invention, the signal-to-noise ratio (SNR) increased by 8 dB in the small signal region, while the SNR decreased by 3 dB in the large signal region. The large signal region is sufficiently robust, by definition, to absorb the 3 dB loss, but the 8 dB gain in the small signal region is significant and could result in a significant increase in the probability of detection for small signals. As explained in detail above, the reduction in quantization error in the small signal region depends on the threshold value ($V_s$) and a greater reduction can be obtained by increasing the sampling rate and reducing the threshold value ($V_s$).

Thus, the present invention provides a flexible, inexpensive and reliable method and device for digitizing full waveforms in a manner which achieves favorable redistribution of the quantization error from the more sensitive small signal region to the more robust high signal region, thereby increasing the probability of detection of signals of interest in the small signal region. By using the present method, the coarseness of the small region can be reduced while still enabling full waveform digitization and without increasing the word length of the A/D converter.

While the preferred forms and embodiments of the invention have been illustrated and described, it will be apparent to those of ordinary skill in the art that various changes and modifications may be made without deviating from the inventive concepts and spirit of the invention as set forth above, and it is intended by the appended claims to define all such concepts which come within the full scope and true spirit of the invention.

What is claimed is:

1. A method for digitizing waveforms, comprising the steps of: selecting a signal threshold value which partitions the dynamic range of the waveform to be digitized into a small signal region and a large signal region; sampling said waveform to obtain a sampled signal therefrom at a given sampling frequency; comparing each sampled signal with the signal threshold value to determine whether said sampled signal is within said small signal region or said large signal region; and directly digitizing said sampled signal if said sampled signal is within said small signal region or differentially digitizing said sampled signal if said sampled signal is within said large signal region, wherein differentially digitizing the sampled signal includes digitizing a value representing the difference between the sampled signal at the present sampling instant and the previous sampling instant.

2. The method as set forth in claim 1, further including the step of flagging the digitized sampled signal to indicate whether the sampled signal was digitized directly or differentially.

3. The method as set defined in claim 1, wherein the step of directly or differentially digitizing said sampled signal includes using an A/D converter having a N-bit output and further including the step of reallocating one bit of said N-bit output to be a flag bit which indicates whether said sampled signal was digitized directly or differentially.

4. The method as defined in claim 3, wherein the step of sampling said waveform includes using a sampling clock having a sampling frequency which enables differentially digitized signal values to be within said small signal region.

5. The method as defined in claim 3, wherein said N-bit output from each of said sampled signals is stored in a data processing device, and further including the step of digitally reconstructing the waveform by using said flag bit to determine whether each of said N-bit output represents a directly digitized signal or a differentially digitized signal, wherein when said N-bit output represents a differentially digitized signal said differentially digitized signal is added to a value of a previous digitized signal.

6. The method as defined in claim 1, wherein the step of selecting said signal threshold value includes choosing said signal threshold value to be less than half of the full dynamic range of the wave form.

7. The method as defined in claim 6, wherein the step of selecting said signal threshold value includes choosing said threshold value to be slightly greater than signal values of said waveform which are desired to be digitized with low quantization error.

8. The method as defined in claim 1, wherein the step of sampling said waveform includes using a first sampling clock having a first sampling frequency when directly digitizing said sampled signal and using a second sampling clock having a second sampling frequency when differentially digitizing said sampled signal.

9. The method as defined in claim 8, wherein the step of using said first sampling clock includes selecting said first sampling clock such that said first sampling frequency is greater than the Nyquist sampling rate.

10. The method as defined in claim 8, further including the step of selecting said second sampling clock such that said second sampling frequency enables differentially digitized signal values to be within said small signal region.

11. The method as defined in claim 1, wherein the step of sampling said waveform to obtain a sampled signal therefrom at a given sampling frequency includes using a sampling clock having a frequency which enables differentially digitized signal values to be within said small signal region.

12. A device for waveform digitization, comprising: means for defining a signal threshold value which partitions the dynamic range of said waveform into a small signal region and a large signal region; means for sampling the waveform to obtain a sampled signal therefrom at a given sampling frequency; means for comparing said sampled signal with said signal threshold value to determine whether the sampled signal is within the small signal region or the large signal region; and means for digitizing said sampled signal including means for directly digitizing said sampled signal if said sampled signal is within said small signal region and means for differentially digitizing said sampled signal if said sampled signal is within said large signal region, wherein said means for differentially digitizing said sampled signal includes means for digitizing a value representing the difference between said sampled signal at a present sampling instant and a previous sampling instant.

13. The device as defined in claim 12, wherein said means for digitizing said sampled signal includes an A/D converter having a N-bit output and further including means for allocating one bit of said N-bit output to be a flag bit which indicates whether said sampled signal was digitized directly or differentially.

14. The device as defined in claim 13, further including a data processing device for storing said N-bit output from each of said sampled signals, and further including means for digitally reconstructing the waveform by using said flag bit to determine whether each of said N-bit output represents a directly digitized signal or a differentially digitized signal, wherein when said N-bit output represents a differentially digitized signal said differentially digitized signal is added to a value of a previous digitized signal.

15. The device as defined in claim 12, wherein said second threshold value is less than half of the full dynamic range of the waveform.

16. The device as defined in claim 12, wherein said signal threshold value is slightly greater than signal values of said waveform which are desired to be digitized with low quantization error.

17. The device as defined in claim 12, wherein said means for sampling said waveform includes a sampling clock having a frequency which enables differentially digitized signal values to be within said small signal region.

18. The device as defined in claim 12, wherein said means for sampling said waveform includes a sampling clock having a sampling frequency which enables differentially digitized signal values to be within said small signal region.

19. The device as defined in claim 12, wherein said means for sampling said waveform includes a first sampling clock having a first sampling frequency for use when directly digitizing said sampled signal and a second sampling clock having a second sampling frequency for use when differentially digitizing said sampled signal.

20. The device as defined in claim 13, wherein said first sampling frequency is substantially equal to the Nyquist sampling frequency.

21. The device as defined in claim 19, wherein said second sampling clock has a second sampling frequency which causes differentially digitized signal values to be within said small signal region.

* * * * *